United States Patent
Okuda et al.

(10) Patent No.: US 6,563,710 B1
(45) Date of Patent: May 13, 2003

(54) ELECTRONIC DEVICE, PANEL DEVICE, AND SUPPORTING RAIL

(75) Inventors: Ryoichi Okuda, Okayama (JP); Tetsuya Waniishi, Okayama (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 09/647,220

(22) PCT Filed: Mar. 30, 1999

(86) PCT No.: PCT/JP99/01618

§ 371 (c)(1),
(2), (4) Date: Dec. 1, 2000

(87) PCT Pub. No.: WO99/51073

PCT Pub. Date: Oct. 7, 1999

(30) Foreign Application Priority Data

Apr. 1, 1998 (JP) ............................................ 10-088367
Jun. 15, 1998 (JP) ............................................ 10-166742

(51) Int. Cl.$^7$ ................................................ H05K 7/20
(52) U.S. Cl. ........................ 361/704; 361/715; 361/823; 361/825; 361/600; 361/679
(58) Field of Search .............................. 165/80.2, 80.3, 165/185; 174/16.3; 361/600, 679, 687, 690, 704, 707, 709–710, 715, 730, 752, 807–811, 825

(56) References Cited

U.S. PATENT DOCUMENTS

| | | | |
|---|---|---|---|
| 5,018,050 A | 5/1991 | Maenishi et al. | 361/386 |
| 5,461,541 A | * 10/1995 | Wentland, Jr. et al. | 361/707 |
| 5,598,322 A | 1/1997 | Von Arx et al. | 361/704 |

FOREIGN PATENT DOCUMENTS

| | | |
|---|---|---|
| DE | 18 15 041.9 | 6/1970 |
| DE | 25 34 800 | 4/1976 |
| DE | 88 15 604.4 | 3/1989 |
| DE | 88 14 859 9 | 4/1989 |
| DE | 93 18 474.3 | 3/1994 |
| DE | 44 10 171 | 4/1995 |
| EP | 0 740 499 A1 | 10/1996 |
| JP | 59-77235 | 5/1984 |
| JP | 60-990 | 1/1985 |
| JP | 61-132688 | 8/1986 |
| JP | 1-165198 | 6/1989 |
| JP | 2-94598 | 4/1990 |
| JP | 3-250794 | 11/1991 |
| JP | 6-120057 | 4/1994 |
| JP | 8-298390 | 11/1996 |
| JP | 9-44269 | 2/1997 |
| JP | 9-162574 | 6/1997 |
| JP | 9-246766 | 9/1997 |

* cited by examiner

Primary Examiner—Gregory Thompson
(74) Attorney, Agent, or Firm—Foley & Lardner

(57) ABSTRACT

A rear opening of a housing 1 is covered by a first plate member portion 35 of a member 4. Heat generating elements 26 and 31 are mounted on a second plate member portions 36 of the member 4, which are elongated from the first plate member portion 35 and which are positioned in the housing 1, thereby causing the back face of the first plate member portion 35 to face the outside of the housing 1. A support rail attaching portion 38 is disposed on the back face. The first plate member portion 35 is grounded via a DIN rail 34 attached to the portion. Even when the housing is configured by a resin, therefore, heat generated by the heat generating elements in the housing can be efficiently discharged to the outside of the housing, with the result that an electronic device of excellent heat radiating properties is obtained.

8 Claims, 11 Drawing Sheets

ELECTRONIC DEVICE, PANEL DEVICE, AND SUPPORTING RAIL

TECHNICAL FIELD

The present invention relates to an electronic device which comprises a heat generating element in a housing, such as a power source device, a timer, or a temperature adjuster, also to a panel device in which plural such electronic devices (a concept including all such as an electric apparatus and an electronic apparatus) are usually accommodated in a same panel with the object of control, monitor, or the like, and also to a support rail which is used for supporting such an electronic device in such a panel in a juxtaposed state, such as a DIN rail.

BACKGROUND ART

As an electronic device which comprises a heat generating element in a housing, for example, known is a power source device such as a switching power source. The power source device incorporates a heat generating element such as a switching transistor or a rectifying diode in a housing. In such a power source device of the conventional art, a housing is configured by a material which is inferior in heat radiating property than a metal, such as a resin. The device incorporates a heat generating element and a heat radiating member which radiates heat generated by the heat generating element, in the housing. The heat radiated from the heat radiating member is discharged to the outside through a large number of heat radiating slit holes which are formed in a side portion of the housing.

In a power source device of another conventional art example, a housing may be configured by a material which is superior in heat radiating property, such as a metal. A heat radiating member is placed in the housing, and heat from the heat radiating member is conducted also to the housing, thereby improving the heat radiation efficiency.

(Technical Problems that the Invention is to Solve)

In the former power source device, however, the periphery of the heat radiating member is covered by the housing made of a resin which is a material having inferior heat radiating properties, and hence there is a problem in that, even when many heat radiating slit holes are formed in the housing, heat of the heat radiating member is hardly dissipated to the outside of the housing, thereby impairing the heat radiating properties of the device.

By contrast, in the latter power source device, the side portion of the housing is configured by a metal which is a material having superior heat radiating properties. Therefore, the device is superior in heat radiating property than the former device. Since the housing material is a metal, however, an insulation distance from the housing must be set to be relatively large so as to prevent an electronic component in the housing from being in contact with the housing. Therefore, the latter power source device has a problem in that, even in the case of a power source of a small capacity, the size of the housing is large and hence the device cannot be made compact and is heavy, with the result that it is very difficult to handle the device.

It is a common object of the invention to provide an electronic device in which, even when a housing is configured by a material such as a resin which is inferior in heat radiating property than a metal, heat generated by a heat generating element in the housing can be efficiently discharged to the outside of the housing, and which therefore has excellent heat radiating properties.

DISCLOSURE OF INVENTION (Solving Method and Effects Superior than Conventional Art)

In order to attain the object, a first feature of the invention is an electronic device comprising: a housing; a first metal member having portions which face to an inside and an outside of the housing, respectively, and attached directly or indirectly to the housing; and a heat generating element which is attached to the portion of the first metal member, the portion facing the inside of the housing.

According to the first feature, even when the housing is configured by a resin which is inferior in heat radiating property, for example, heat generated by the heat generating element attached to the portion of the first metal member facing the inside of the housing is easily radiated to the outside of the housing through the portion of the first metal member facing the outside of the housing. Therefore, the electronic device has excellent heat radiating properties.

A second feature of the invention is an electronic device comprising: a housing; a first metal member facing an outside of the housing; a second metal member which is formed integrally with the first metal member, or coupled to the first metal member directly or via another metal member, and which is located in the housing; and a heat generating element which is attached to the second metal member.

According to the second feature, even when the housing is configured by a resin which is inferior in heat radiating property, for example, heat generated by the heat generating element attached to the second metal member is conducted from the second metal member to the first metal member. Since the first metal member faces to the outside of the housing, the generated heat is easily radiated to the outside of the housing. Therefore, the electronic device has excellent heat radiating properties.

A third feature of the invention is an electronic device in which the electronic device of the second feature is configured so that the second metal member is elongated into the housing, and the heat generating element is attached to an elongated portion.

According to the third feature, when the elongated portion is arbitrarily elongated, the attaching position of the heat generating element can be freely set, so that an electronic component in the housing can be placed in a very easy manner or the degree of freedom in design is improved. On the other hand, since the elongated portion is coupled to the first metal member facing the outside of the housing, heat generated by the heat generating element can be easily radiated to the outside. Therefore, the electronic device has excellent heat radiating properties.

A fourth feature of the invention is an electronic device in which the electronic device of any one of the first to third features is configured so that a rear portion of the housing is opened, and the rear opening of the housing is covered with the first metal member.

According to the fourth feature, a metal member having a large area can be used as the first metal member, and hence heat generated by the heat generating element can be easily conducted to the outside. Therefore, an electronic device of further excellent heat radiating properties can be obtained.

A fifth feature is an electronic device in which the electronic device of any one of the first to fourth features is configured so that a support member attaching portion is disposed in a portion of the first metal member facing the outside of the housing.

According to the fifth feature, since the support member attaching portion is disposed in a portion of the first metal member facing the outside of the housing, the device can be used for attaching a support member.

A sixth feature is an electronic device in which the electronic device of the fifth feature is configured so that the support member attaching portion can be grounded through a support member attached to the support member attaching portion.

According to the sixth feature, when the device is attached to the support member, the member can perform a shielding function against electrical noises generated from an internal electronic component.

A seventh feature is an electronic device having: a housing in which a rear portion is opened, and which has a terminal block attaching hole in a front side; and device configuring members which can be incorporated into the housing through the housing rear opening, the device configuring members including at least: a circuit board on which the terminal block is mounted; a heat generating element; and a metal member, the circuit board being accommodated in the housing so that, under the incorporated state, the terminal block positionally corresponds to the terminal block attaching hole in the front side of the housing, the metal member serving under the incorporated state as a covering member for the housing rear opening, the heat generating element being attached to at least a portion of the metal member which is located in the housing.

According to the seventh feature, in addition to the effect of heat radiating properties due to the metal member, assembling of the device is completed only by accommodating the device configuring member through the housing rear opening. Therefore, assembling is easy, and also the time period required for assembling is shortened. Since the metal member serves as a covering member for the rear opening of the housing, moreover, the device itself can be made compact.

An eighth feature of the invention is an electronic device in which the electronic device of the seventh feature is configured so that, under an integrated state in which the circuit board is attached to the metal member, the device configuring member can be accommodated into the housing through the housing rear opening.

According to the eighth feature, assembling of the device configuring members themselves has been already completed, and hence assembling of the device configuring members into the housing is further simplified.

A ninth feature is an electronic device having: a housing in which a rear portion is opened, and which has a terminal block attaching hole in a front side; and device configuring members which can be incorporated into the housing through the housing rear opening, the device configuring members including at least: a circuit board on which the terminal block is mounted; a heat generating element; and first and second metal members, the circuit board being accommodated in the housing so that, under the incorporated state, the terminal block positionally corresponds to the terminal block attaching hole in the front side of the housing, the first metal member serving under the incorporated state as a covering member for the housing rear opening, the second metal member being formed integrally with the first metal member, or coupled to the first metal member directly or via another metal member, the heat generating element being attached to the second metal member, the second metal member being located in the housing under the incorporated state.

According to the ninth feature, in addition to the effect of heat radiating properties due to the metal members, assembling of the power source device is completed only by accommodating the device configuring members through the housing rear opening. Therefore, assembling is easy, and also the time period required for assembling is shortened. Since the first metal member serves as a covering member for the rear opening of the housing, moreover, the device itself can be made compact.

A tenth feature of the invention is an electronic device in which the electronic device of the ninth feature is configured so that, under an integrated state in which the circuit board is attached to at least one of the first or second metal member, the device configuring members can be accommodated into the housing through the housing rear opening.

According to the tenth feature, assembling of the device configuring members themselves has been already completed, and hence assembling of the device configuring members into the housing is further simplified.

An eleventh feature is an electronic device in which the electronic device of the ninth or tenth feature is configured so that the circuit board includes first and second circuit boards which are respectively located and accommodated in front and rear sides of the housing so as to be separated from each other in parallel with or in substantially parallel with each other, the terminal block is mounted on the first circuit board, an electronic component constituting a noise filter circuit is mounted on the first circuit board, and an electronic component generating electrical noises is mounted on the second circuit board.

According to the eleventh feature, the first circuit board and the second circuit board are separated by a distance in the housing. Even when noises generated from the electric noise generating electronic component mounted on the second circuit board try to be transmitted through the air, therefore, the noises are blocked by the first circuit board. As a result, the possibility that the noises enter the terminal block mounted on the first circuit board is lowered. Therefore, the electronic device has excellent noise resistance.

A twelfth feature is an electronic device which has a heat generating element in a housing, and in which a rear portion of the housing is supported by a support rail made of a metal, wherein a heat generating element attaching member is placed so as to face a rear opening of the housing, the heat generating element attaching member or the heat generating element is enabled to be directly or indirectly in contact with the support rail under a state where the support rail is attached to the opening, and the contact allows heat generated by the heat generating element to be radiated to a side of the support rail.

According to the twelfth feature, heat radiation can be performed through the support rail. Even when the housing is configured by a material such as a resin which is inferior in heat radiating property than a metal, therefore, heat generated by the heat generating element in the housing can be efficiently discharged to the outside of the housing, and the electronic device has excellent noise resistance. Furthermore, the support rail is sufficiently wide and long, and has sufficient heat radiating properties. Consequently, it is not required to dispose a heat radiating plate or the like in the housing, and hence the device can be further miniaturized.

A thirteenth feature is a panel device in which one or more of the electronic device of claim 12 is accommodated in a panel under a state where the device is supported by a support rail, the support rail has a cavity, and a heat discharging gas is enabled to be introduced from an outside of the panel into the cavity and then discharged to the outside of the panel.

According to the thirteenth feature, when the support rail is passed through the panel, the cavity allows, for example, the outside air serving as the heat discharging gas to be introduced from an inlet on one side of the cavity of the support rail, and the outside air is discharged from an outlet on another side of the cavity. In the discharge of the outside air, heat of the heat generating element in the electronic device is conducted to the air in the cavity of the support rail, and the cavity air to which the heat is conducted is discharged to the outside. Therefore, the heat radiation efficiency with respect to the head generated by the heat generating element is excellent. Since it is not required to form a suction port in the panel, the air itself in the panel is isolated from the outside. Unlike the conventional art, consequently, air is not sucked together with dust through a suction port into the panel, and the air in the panel is not contaminated. Moreover, the support rail can be easily cooled, and hence its heat radiation efficiency can be enhanced more easily. Since a suction port is made unnecessary, the panel can be hermetically sealed so as to attain good waterproofness.

A fourteenth feature is a support rail for supporting an electronic device which has a heat generating element inside a housing, wherein the support rail has a cavity which passes through the support rail from one end side to another end side, and a structure in which heat conducted from the heat generating element is discharged by a gas that flows into from the one end side of the cavity and then flows out from the other end side.

According to the fourteenth feature, a structure is obtained in which heat conducted from the heat generating element is discharged via the cavity which passes through from one end side to the other end side, by a gas which flows into from the one end side of the cavity and then flows out from the other end side. Therefore, it is possible to attain the same effects as the panel device which uses the support rail.

A fifteenth feature is a support rail in which the support rail of the fourteenth feature is configured so that heat radiating fins are disposed in the cavity.

According to the fifteenth feature, since heat radiating fins are disposed in the cavity, it is possible to attain the effect that the heat radiation efficiency can be further enhanced.

In the metal members described above, a metal is used as a constituting material. The metal members are not restricted to those which are thoroughly configured by a metal. Also a member which partly contains a material other than a metal, or that which is integrated or connected with a material other than a metal is included in the invention.

The attachment of the heat generating element to the second metal member has a broad meaning including all cases where a portion of the heat generating element other than leads is attached by screws, bonded by using an adhesive agent, or closely contacted by applying a pressing force by using a plate spring, and where the heat generating element is attached to the second metal member by other means in a manner that heat radiation is enabled.

BEST MODE FOR CARRYING OUT THE INVENTION

Hereinafter, embodiments of the invention will be described in detail with reference to the accompanying drawings.

Cases where the electronic device of the invention is applied to a power source device, particularly to a switching power source device will be described. However, the invention is not restricted to such cases, and may be of course applied to other power source devices, and also to usual electronic devices which comprises a heat generating element in a housing.

Figure 1:
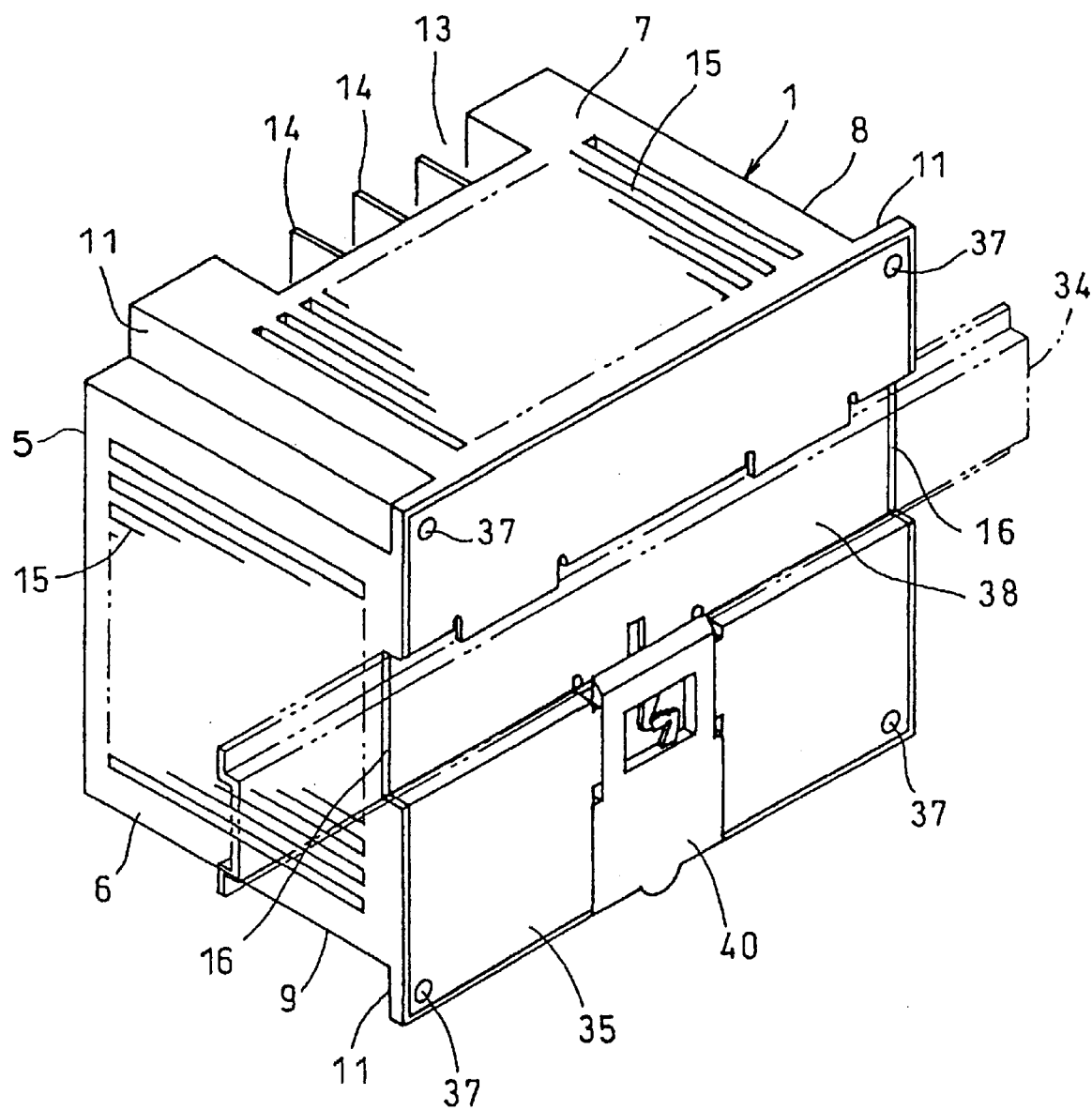
FIG. 1 is an external perspective view of a power source device relating to an embodiment of the invention.
Figure 2:
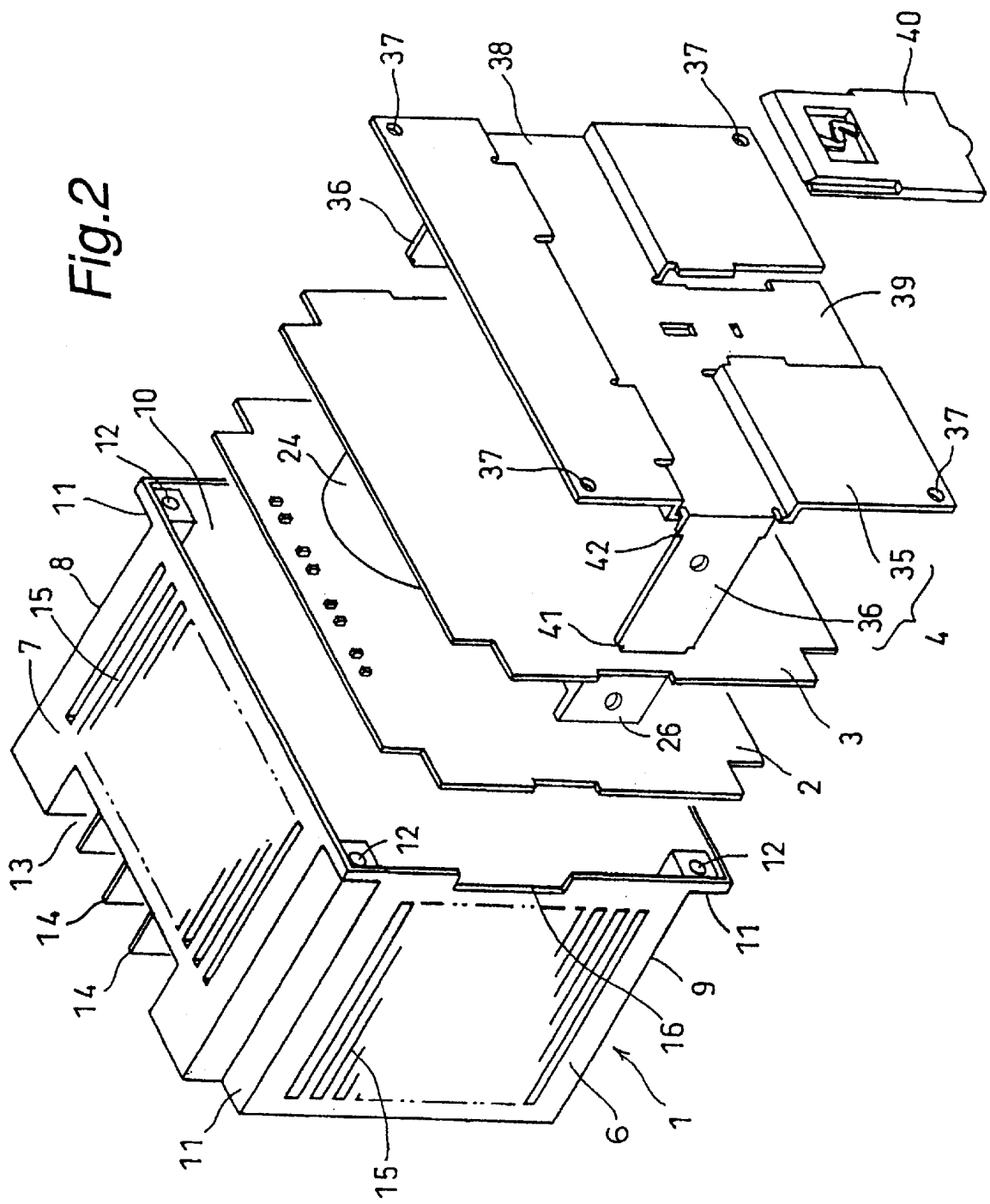
FIG. 2 is an exploded perspective view of the embodiment shown in FIG. 1.
Figure 3:
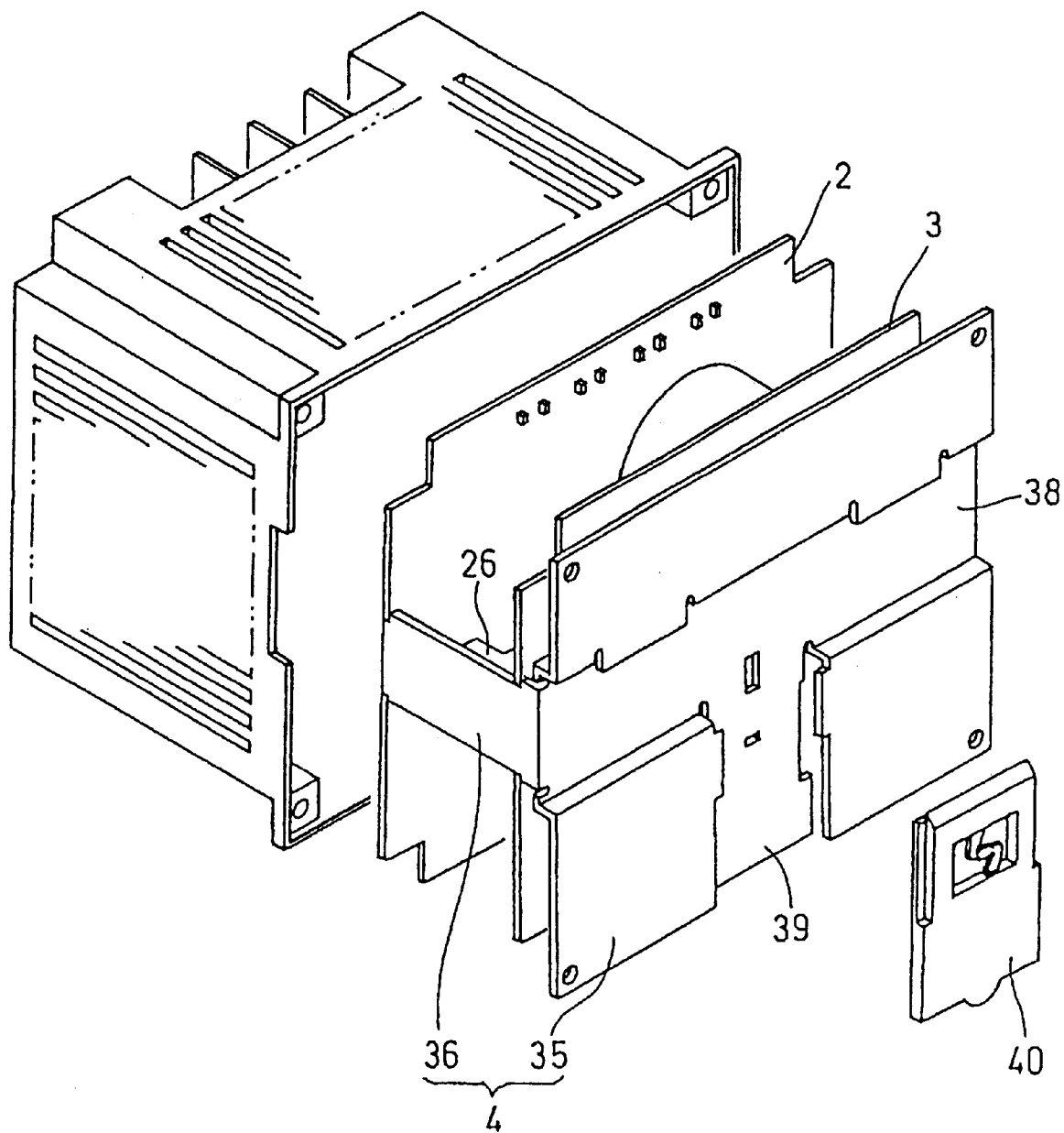
FIG. 3 is an exploded perspective view of the embodiment shown in FIG. 1.
Figure 4:
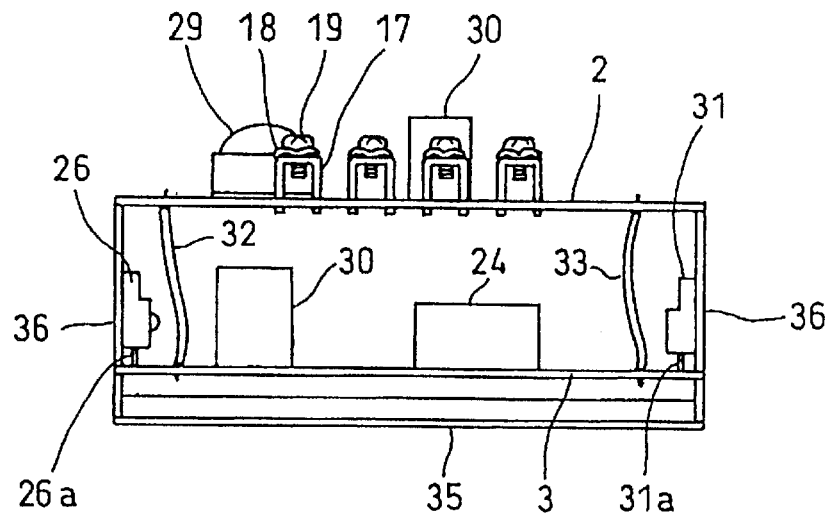
FIG. 4 is a transverse section view showing the internal structure of the embodiment with omitting a housing.
Figure 5:
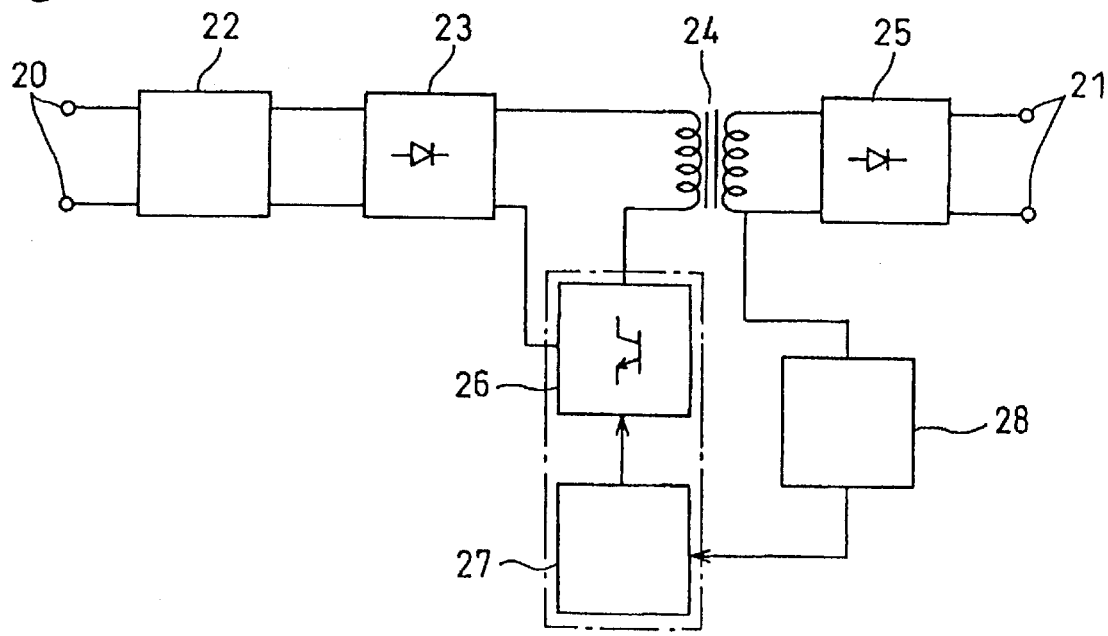
FIG. 5 is a block circuit diagram showing the circuit configuration.

An embodiment of the invention will be described in detail with reference to FIGS. 1 to 5. FIG. 1 is an external perspective view as seeing a switching power source device (hereinafter, referred to merely as "power source device") relating to the embodiment from an obliquely rear side, FIGS. 2 and 3 are exploded perspective views of the device, FIG. 4 is a transverse section view showing the internal structure with omitting a housing, and FIG. 5 is a circuit diagram of the power source device.

In the figures, the power source device of the embodiment comprises a housing 1, two or first and second circuit boards 2 and 3, and a metal member 4.

The housing 1 includes a material which is inferior in heat radiating property than a metal, such as a resin or a resin and another material. In at least a side portion of the housing 1, particularly, a resin is used as a material, or a resin is used as a main material. The housing 1 has a rectangular cylindrical shape which is configured by a front portion 5 and four side portions 6 to 9 so as to have an opening 10 in a rear side. In the housing 1, four edges where the side portions 6 to 9 are adjacent to each other are formed as recesses 11 which elongate from the front side to the rear side. Each of the recesses 11 has a screw hole 12 in a rear portion (FIG. 2). The housing 1 has a recess 13 in a front portion, and plural insulation flanges 14 are integrally formed in the recess 13 at regular intervals. Terminal block attaching holes (which are not shown in the drawings) are formed in a bottom portion in the recess between the insulation flanges 14. In the side portions 6 to 9 of the housing 1, a large number of heat radiating slit holes 15 are juxtaposed in a grid-like manner. A cutaway 16 for passing a DIN rail (in a broad sense, the type of the rail is not restricted to a DIN rail and may be a support rail) which is used as a support member that will be described later is formed in each of the rear ends of the pair of opposed side portions 6 and 8 of the housing 1.

The first circuit board 2 is accommodated on the front side in the housing 1, and the second circuit board 3 is accommodated on the rear side in the housing 1. As shown in FIG. 4, plural terminal blocks 17 are mounted on the surface (this surface is a face opposed to the inner face of the front side of the housing 1) of the first circuit board 2, so as to correspond to the formation intervals of the terminal block attaching holes. A terminal clamp 18 and a terminal 19 are attached to each of the terminal blocks 17. The lower ends of the terminal blocks 17 are passed through the first circuit board 2 and then fixed to the rear face of the board by soldering. Electronic components mounted on the circuit boards 2 and 3 have the circuit configuration shown in FIG. 5. The circuit configuration will be briefly described.

The circuit has a pair of input terminals 20 and a pair of output terminals 21. Between the pair of input terminals 20 and the pair of output terminals 21, the circuit has a noise filter circuit 22, an input rectifying and smoothing circuit 23, a converter transformer 24, and an output rectifying and smoothing circuit 25. The circuit further has a switching transistor 26, a driving circuit 27 for the switching transistor 26, and a switch circuit 28. An AC voltage through the pair of input terminals 20 is passed through the noise filter circuit 22, and then converted into a DC voltage by the input rectifying and smoothing circuit 23, and the DC voltage is input into the primary winding of the converter transformer 24. On the other hand, the switching transistor 26 is turned on and off via the driving circuit 27 by a signal from the switch circuit 28, and a voltage which is induced in the secondary winding of the converter transformer 24 is again converted into a DC voltage by the output rectifying and smoothing circuit 25 to be output to the pair of output terminals 21.

As electronic components constituting such a circuit, the pair of input terminals 20 and the pair of output terminals 21 which are to be connected to ones of the terminal block 17 are on the first circuit board 2. Furthermore, electronic components 29 constituting the noise filter circuit 22, such a coil and a capacitor, and electronic components 30 constituting the input rectifying and smoothing circuit 23, such as a capacitor and a diode are mounted on the first circuit board 2. By contrast, the converter transformer 24, electronic components 30 constituting the output rectifying and smoothing circuit 25, such as a diode 31 and a capacitor, the switching transistor 26, and electronic components such as a switch circuit are mounted on the second circuit board 3. However, illustration of the electronic components are often omitted.

A heating element in the power source device is configured by, for example, the switching transistor 26, and the rectifying diode 31 in the output rectifying and smoothing circuit 25. Lead wires 26a and 31a of the switching transistor 26 and the rectifying diode 31 are fixed to the second circuit board 3 by soldering. Electrical connections between the circuit boards 2 and 3 are realized by plural lead wires 32 and 33.

As shown in FIG. 2, the metal member 4 is integrally configured by a first plate member portion (corresponding to the first metal member) 35, and second plate member portions 36 (corresponding to the second metal member). The first plate member portion 35 has a rectangular shape in a plan view, and a structure for attaching a DIN rail 34. By contrast, the second plate member portions 36 are formed by bending the sides of the first plate member portion 35 so as to be raised forward and perpendicularly form the sides, thereby configuring a pair of right and left portions.

A screw attaching hole 37 is disposed in each of four corners of the first plate member portion 35. The screw attaching holes 37 correspond to the screw holes 12 disposed in a rear portion of the recesses 11 which are located in the four corners of the housing 1, respectively. A DIN rail attaching groove 38 which has a width enabling a DIN rail to be passed in a DIN rail attaching direction is disposed in the back face of the first plate member portion 35. A DIN rail engaging member 40 made of a resin is disposed in a groove 39 which is perpendicular to the center of the attaching groove 38 and communicates therewith. The resin-made DIN rail engaging member 40 elastically protrudes toward the attaching groove 38 so as to be engageable with a DIN rail.

Each of the second plate member portions 36 has recesses 41 which are engageable with the first circuit board 2, and steps 42 which are engageable with the second circuit board 3. On the other hand, the heat generating elements or the switching transistor 26 and the rectifying diode 31 are soldered onto the second circuit board 3 as described above. The heat generating elements are placed on the second circuit board 3 so as to be in close contact with the surfaces of the plate member portions 36, respectively.

In assembling of the configuring members of the power source device of the embodiment into the housing 1, the recesses 41 and the steps 42 disposed in the second plate member portions 36 of the metal member 4 are engaged with the circuit boards 2 and 3 on which predetermined electronic components are mounted, respectively. Next, the switching transistor 26 and the rectifying diode 31 are attached to the second plate member portions 36 by screws which are not shown, respectively. The first plate member portion 35 is assembled so as to cover the opening 10 in the rear portion of the housing 1 to configure the rear portion of the housing 1, thereby completing assembling of the power source device.

The thus assembled power source device of the embodiment is attached to the DIN rail 34. In this case, when the DIN rail 34 is grounded, the member 4 is grounded through the DIN rail 34 because the first plate member portion 35 is in direct contact with the DIN rail 34. Even when electrical noises are generated from components in the power source device, such as the converter transformer 24 or the switching transistor 26, therefore, the components are shielded, and hence it is possible to suppress the noises from adversely affecting the surroundings.

In the embodiment, the first plate member portion 35 is grounded. Alternatively, the second plate member portions 36 may be deformed so as to be electrically connected to the DIN rail 34 to be grounded. The first plate member portion 35 or the second plate member portions 36 may be electrically connected via a lead wire to the DIN rail 34 to be grounded. When such a connection is performed, the grounding effect is further enhanced.

When the DIN rail 34 is not grounded, the first plate member portion 35 is not grounded trough the DIN rail 34. Alternatively, for example, a ground line may be placed along the DIN rail 34, and the first plate member portion 35 may be made in contact with the line to be grounded.

The size of the second plate member portions 36 may be made larger than that in the embodiment, so that the internal electronic components are covered by the plate member portions 35 and 36, thereby enhancing the shielding effect.

In the power source device of the embodiment, at least the side portion of the housing 1 is made of a resin. Unlike the conventional art example in which the whole of the housing is made of a metal, therefore, it is not required to ensure an insulation distance from the internal electronic components. Consequently, the housing can be miniaturized and lightened, so that the power source device can be miniaturized and lightened.

In the power source device of the embodiment, although the housing 1 is configured by a resin which is inferior in heat radiating property, the second plate member portion 35 faces in a large area to the outside so as to configure the rear portion of the housing 1. Furthermore, the first plate member portion 35 and the second plate member portions 36 are formed by a single member. Therefore, heat generated by heat generating elements attached to the second plate member portions 36 is easily conducted from the second plate member portions 36 to the first plate member portion 35, with the result that it is possible to obtain a power source device which is very excellent in heat radiating property.

The second plate member portions 36 may be called a heat radiating member, and the first plate member portion 35 may be called a DIN rail attaching portion or a shielding portion. Alternatively, the whole of the plate member portions 35 and 36 may be called a heat radiating member. In the case where the whole of the plate member portions 35 and 36 is called a heat radiating member, the member 4 may be partly elongated into the housing 1, an elongated portion may be formed as the second plate member portions 36 to serve as a heat radiating member, and the remaining portion may be formed as the first plate member portion 35 and called a DIN rail attaching portion, a shielding portion, or a heat radiating member.

The groove 38 for attachment to a DIN rail is formed in the back face of the first plate member portion 35. However, the shape of the groove 38 is an example. The back face may be formed as a ridge, and a support rail having a U-like section shape, or a support rail having a T-like section shape such as a DIN rail may be attached to the ridge.

The second plate member portions 36 have a flat face. Alternatively, the portions may be formed into a fin-like shape so as to further enhance the heat radiating effect.

The number of the internal circuit boards 2 and 3 is two. The number is not restricted to the value, and any number of circuit boards may be used.

The embodiment is configured so that heat generating elements are attached to the second plate member portions 36. Alternatively, a configuration may be employed in which, while the second plate member portions 36 remain as they are or are omitted, a heat generating element is attached to a place of the first plate member portion 35 and facing the inside of the housing 1.

The metal member 4 is not restricted to a member the whole of which is configured by a metal, and may be a member which is partly configured by a metal. For example, a portion to which a heat generating element is attached is made of a metal, a portion to which a DIN rail is to be attached is made of a metal, the places are connected to each other by means of a metal, and the other portion is configured by a material other than a metal. In the invention, the metal member is not required to be thoroughly configured by a metal, as far as the whole or a part of the effects of the invention can be attained. Also a member which contains in part a material other than a metal is interpreted as the metal member.

The metal member 4 is not restricted to a member the whole of which is configured by a metal, and which covers the rear opening of the housing 1. As the metal member 4, a member in which a metal plate and a resin plate are integrated or coupled with each other may be used. The member may cover the rear opening of the housing 1.

The power source device of the embodiment is of the type in which the device is to be attached to a DIN rail serving as a supporting member. The embodiment may be applied also to a type in which a floor or a work bench is used as a supporting member and the device is placed on the member. Furthermore, the embodiment may be applied also to a type in which the device is attached by screws to an appropriate panel face serving as a supporting member. In such cases, the first plate member portion 35 may be grounded by adequately making in contact or connecting with an appropriate grounding member, an apparatus, or a lead.

Figure 6:
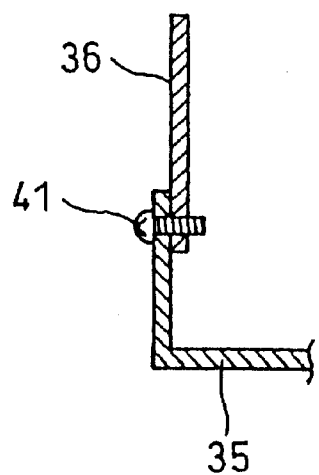
FIG. 6 is a section view of main portions of a power source device relating to another embodiment of the invention.

In the embodiment described above, the first plate member portion 35 and the second plate member portions 36 are formed as an integrated structure by the single member 4. Alternatively, both the plate member portions 35 and 36 may be separately configured as shown in FIG. 6, and fixedly connected to each other by other connecting means such as a screw 41. In this case, the first plate member portion 35 and the second plate member portions 36 are directly coupled to each other. The plate member portions 35 and 36 may be indirectly coupled via another plate member portion (member) between the plate member portions 35 and 36. It is not necessary to restrict the number of coupled plate member portions.

Figure 7:
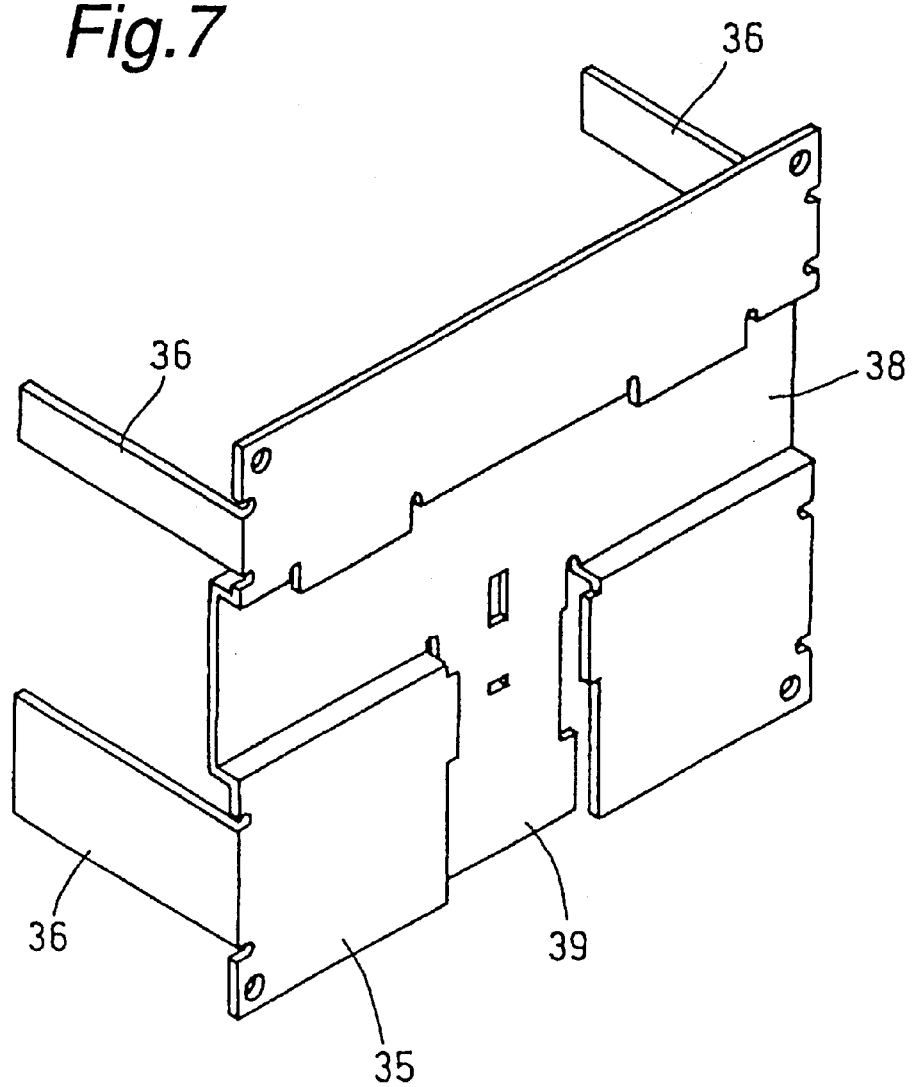
FIG. 7 is a perspective view of main portions of a power source device relating to a further embodiment of the invention.

In the embodiment described above, each of the second plate member portions 36 is disposed on one of both sides of the first plate member portion 35. Alternatively, plural second plate member portions 36 may be disposed on each of the sides, or, as shown in FIG. 7, plural second plate member portions 36 may be disposed on one side portion of the first plate member portion 35, and heat generating elements may be attached to the second plate member portions 36, respectively.

Figure 8:
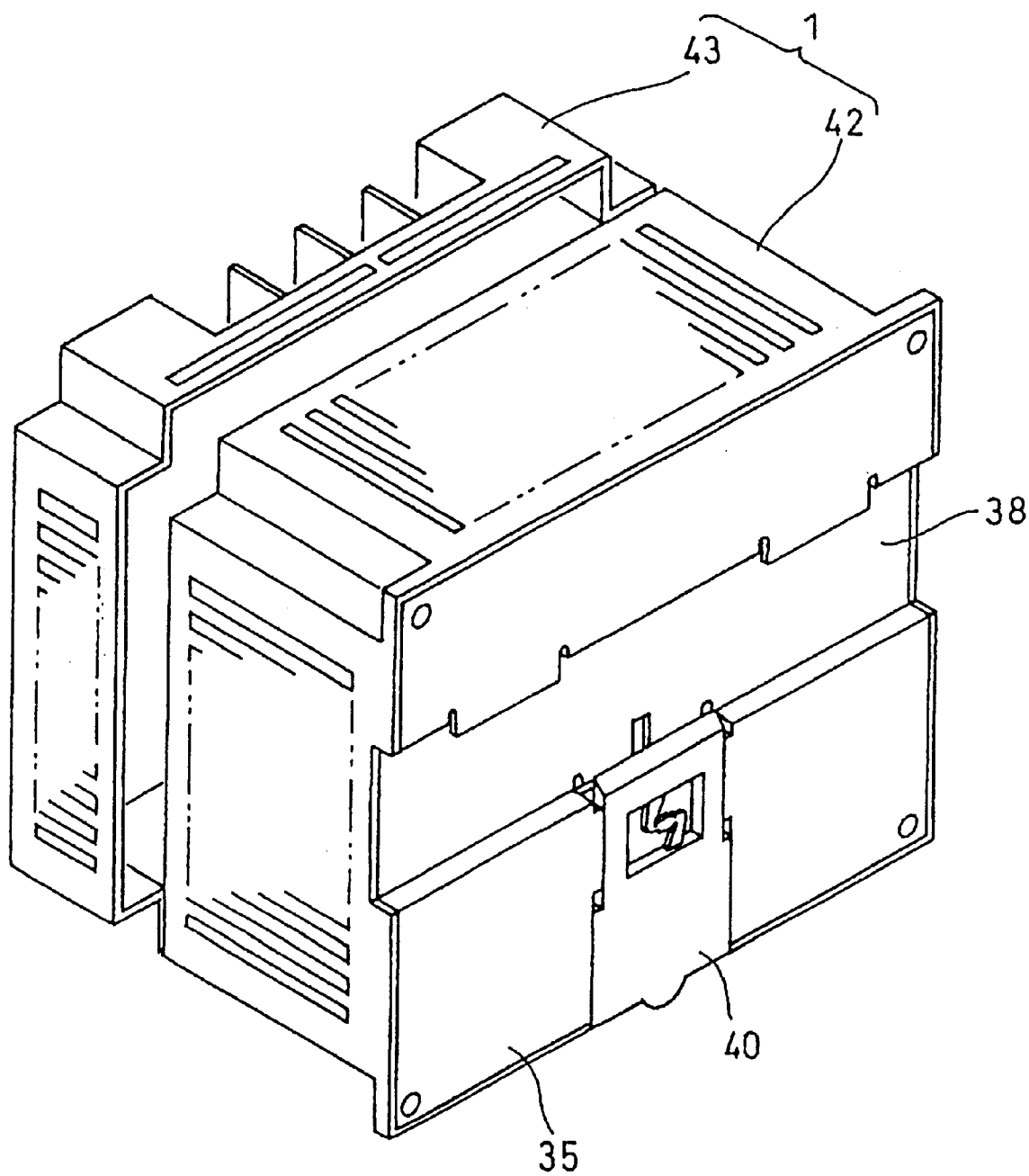
FIG. 8 is an external perspective view of a power source device relating to a still further embodiment of the invention.

The embodiment described above has a structure which has no cover. As shown in FIG. 8, the housing 1 may be configured so as to be split into a housing body portion 42 and a cover 43.

Figure 9:
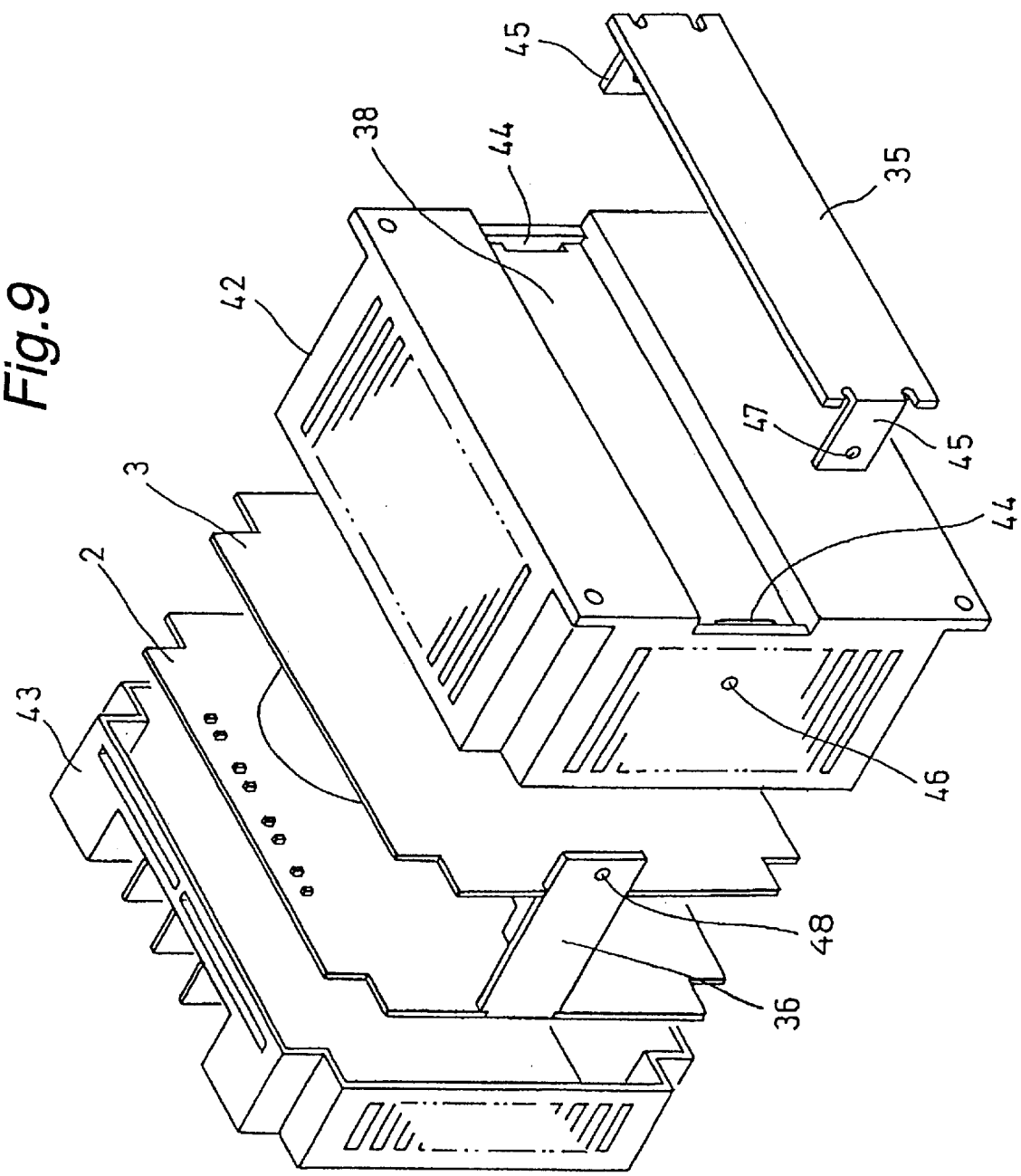
FIG. 9 is an exploded perspective view of a power source device relating to a still further embodiment of the invention.

In the embodiment described above, the rear portion of the housing 1 is opened. Alternatively, as shown in FIG. 9, the front portion of the housing is opened, a structure may be employed in which the cover 43 is attached as described above, and the rear portion of the housing 1 is closed. The first plate member portion 35 and the second plate member portions 36 may be split so as to be formed as separate members. In this case, the circuit boards 2 and 3 are engaged with the second plate member portions 36, and these members are inserted from the front portion of the housing body portion 42. Thereafter, projections 45 which are located on both sides of the first plate member portion 35 are passed through slits 44 formed in the rear portion of the housing body portion 42, respectively. After the plate member portions 35 and 36 are positioned, screws (not shown) which have been passed through screw holes 46 of side portions of the housing body portion 42 are passed through screw holes 47 and 48 of the plate member portions 35 and 36, respectively, whereby the plate member portions 35 and 36 are coupled to each other in the housing 42.

In FIG. 9, the rear groove 39 of the housing 1 for attachment to a DIN rail is omitted. It is a matter of course that such a groove may be formed so as to be attachable to a DIN rail.

In the embodiment described above, when device configuring members are configured by: the first circuit board 2 on which the terminal blocks 17 and the electronic components 29 for the noise filter circuit are mounted; the second circuit board 3 on which the electronic components that easily generate electric noises, such as the converter transformer 24 are mounted; the heat generating elements 26 and 31 such as the switching transistor and the rectifying diode; and the metal member 4 consisting of the first and second plate member portions 35 and 36, the above-mentioned effects are attained on heat radiating properties due to the plate member portions 35 and 36. Furthermore, assembling of the power source device is completed only by accommodating the device configuring members through the rear opening 10 of the housing 1. Therefore, assembling is easy, and also the time period required for assembling is shortened. Since the first plate member portion 35 serves as a covering member for the rear opening 10 of the housing 1, moreover, the power source device itself can be miniaturized.

In this case, the circuit boards 2 and 3 are respectively located and accommodated in front and rear sides of the housing 1 so as to be separated from each other in parallel with or in substantially parallel with each other, and hence the power source device can be thinned. The first circuit board 2 and the second circuit board 3 are separated from each other by a predetermined distance in the housing 1. The first circuit board 2 is located between the terminal block 17 and the second first circuit board 3. According to this structure, even when noises generated from the electric noise generating electronic components mounted on the second circuit board 3 try to be transmitted through the air, the noises are blocked by the first circuit board 2. As a result, the possibility that the noises enter the terminal block 17 mounted on the first circuit board 2 is lowered, and the noises are prevented from leaking from the terminal block 17 to the outside. Therefore, a power source device which is excellent in noise processing is obtained. The device configuring members are integrated by attaching the circuit boards 2 and 3 to at least one of the first or second plate member portion 35 or 36, particularly, in the embodiment, the second plate member portions 36. When accommodation into the housing 1 is to be performed through the front opening of the housing 1, therefore, assembling of the device configuring members themselves has been already completed. As a result, the work of accommodating the device configuring members into the housing 1 is completed by one-touch operation, so that the easiness of the assembling is remarkably improved.

A switching power source which is an example of a power source device relating to another embodiment of the invention will be described with reference to FIGS. 10 to 12.

Figure 10:
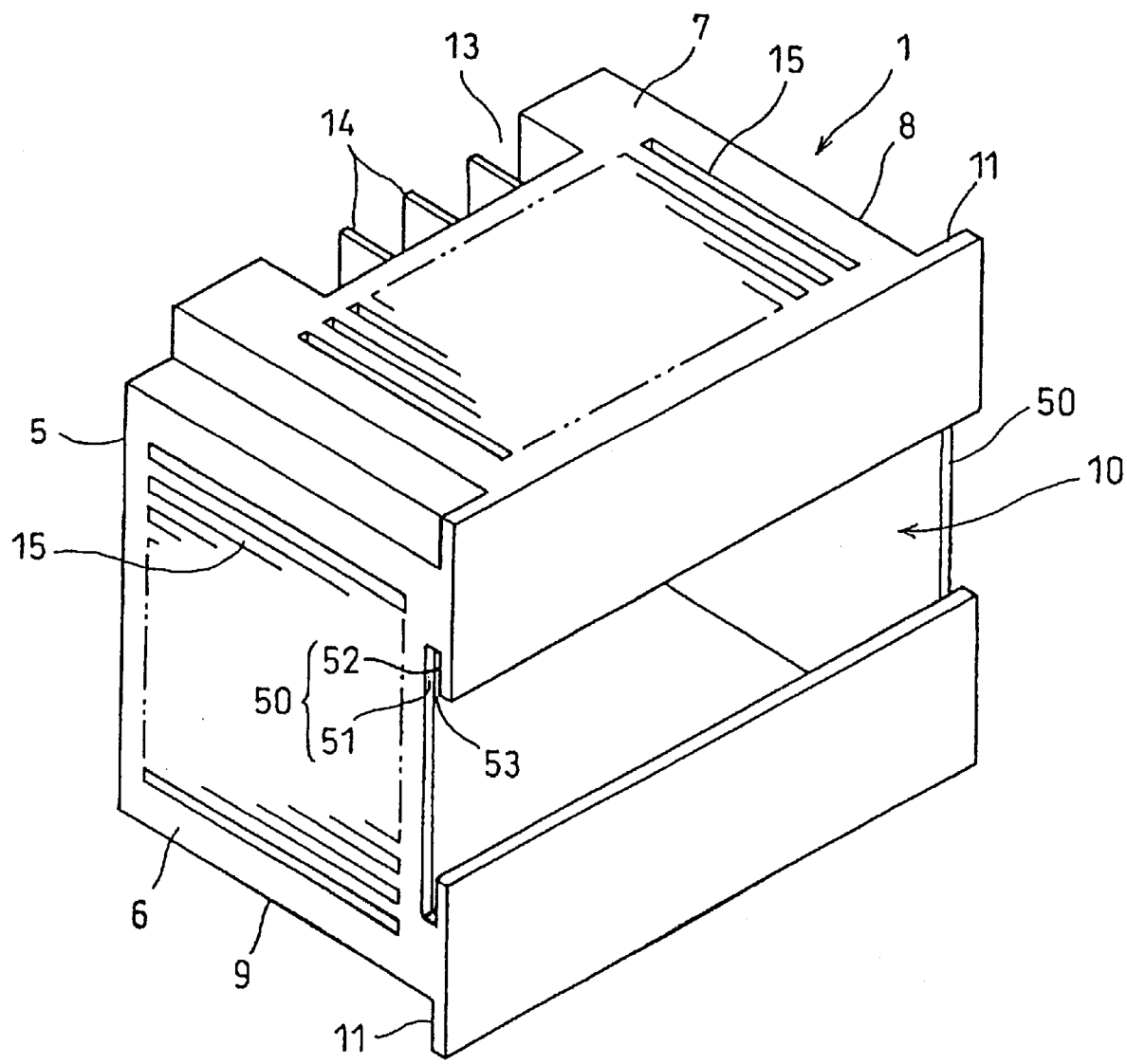
FIG. 10 is an external perspective view of a housing in a power source device relating to a still further embodiment of the invention.

FIG. 10 shows the external configuration of the housing 1 of the switching power source. Portions corresponding to those of FIG. 1 are denoted by the same reference numerals. In the embodiment, necessity of disposing a heat radiating plate or the like in the housing is eliminated, whereby the power source device can be further miniaturized.

Figure 11:
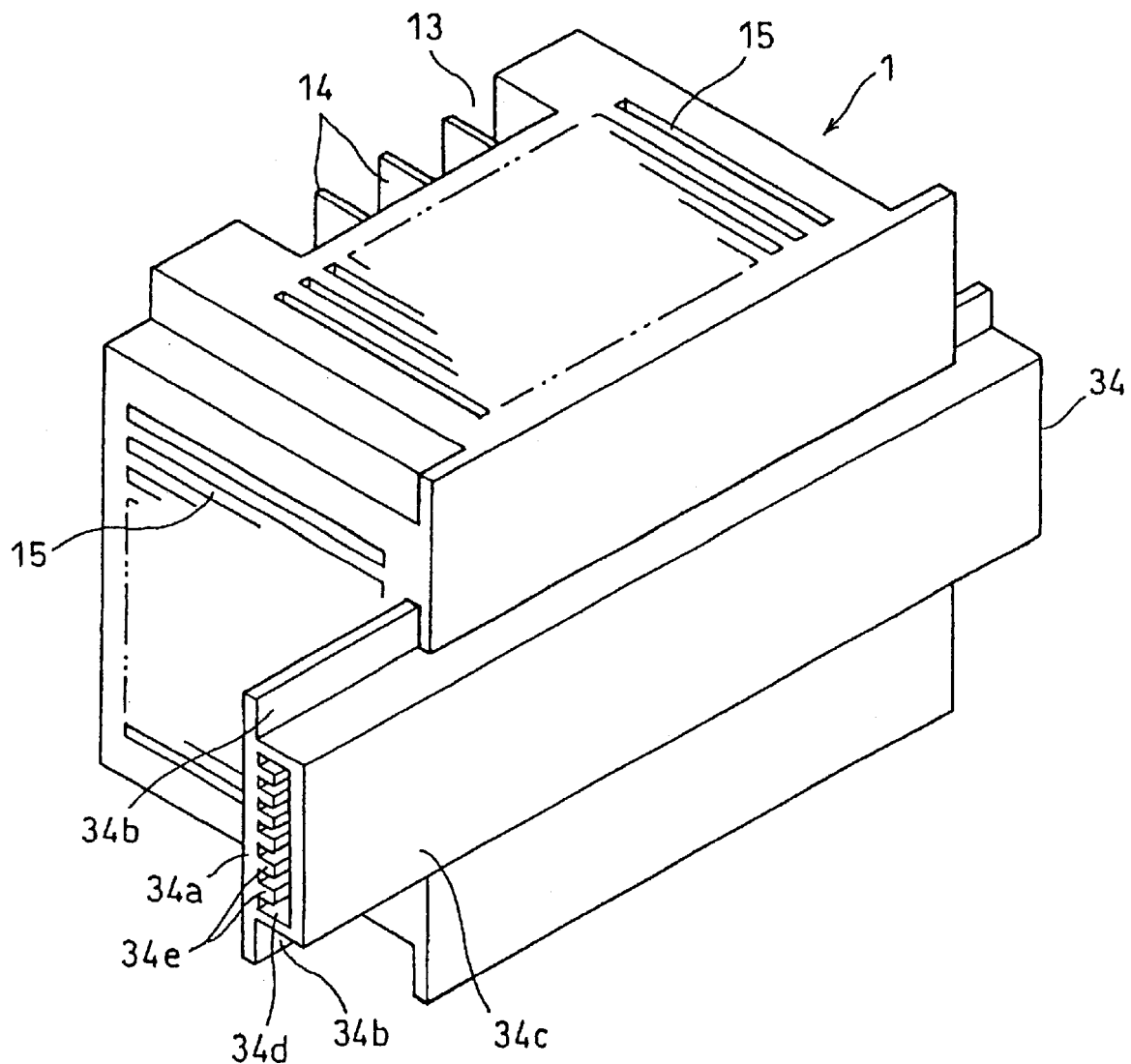
FIG. 11 is an external perspective view showing a state where a support rail is attached to the housing of FIG. 10.

As shown in FIGS. 10 and 11, a cutaway 50 for supporting and passing a support rail 34 such as a DIN rail is formed in a rear end face of each of the side portions 6 and 8 of the housing 1. Each of the cutaways 50 has a front engaging face 51 which is to be engaged with a front face portion 34a of the support rail 34, and rear engaging faces 52 which are to be engaged with a rear face portion 34b. The rear engaging faces 52 cooperate with the front engaging face 51 to constitute gaps 53 which are to be engaged with elongated portions 34b on both the sides of the support rail 34, respectively. Therefore, the elongated portions 34b of the support rail 34 can be passed through the gaps 53 between the engaging faces 51 and 52.

As shown in FIG. 11, the support rail 34 comprises a body portion 34c, and the elongated portions 34b which vertically elongate from the upper and lower sides of the body portion 34c, respectively. The inner portion of the body portion 34c is formed as a cavity 34d which is passed from one end side to the other end side. Plural heat radiating fins 34e for further enhancing the heat radiation efficiency are disposed in the cavity 34d.

The support rail 34 is inserted into the cutaways 50 so as to cover the rear opening 10 of the housing 1, to be attached thereto, as shown in FIG. 11. The attached state will be described with reference to FIG. 12. In the housing 1, a substrate 53 for attaching the switching transistor 26 and the diode 31 (hereinafter, referred to as the heat generating elements 26 and 31) is equipped. Lead wires 26a and 31a of the heat generating elements 26 and 31 are soldered to the attachment substrate 53 in a state where the lead wires are bent, and the heat generating faces of the heat generating elements 26 and 31 are placed so as to be in contact with the attachment substrate 53. The attachment substrate 53 is fixed in the housing 1 so as to be in contact with the front face portion 34a of the support rail 34 via an electrical insulating member 54 which is superior in heat radiating property, such as heat conductive rubber or the like. Therefore, the electrical insulating member may be called a heat conductive member.

Therefore, heat generated by the heat generating elements 26 and 31 is conducted from the electrical insulating member 54 to the support rail 34, to be radiated from the support rail 34. Even when the housing 1 is configured by a material such as a resin which is inferior in heat radiating property than a metal, heat generated by the heat generating elements 26 and 31 in the housing 1 can be efficiently discharged from the support rail 34 to the outside of the housing 1. Therefore, a power source device such as a switching power source which is excellent in heat radiating property can be obtained. As a result, it is not required to dispose a heat radiating plate or the like for radiating heat generated by the heat generating elements 26 and 31, in the housing 1, whereby the power source device can be further miniaturized.

Figure 12:
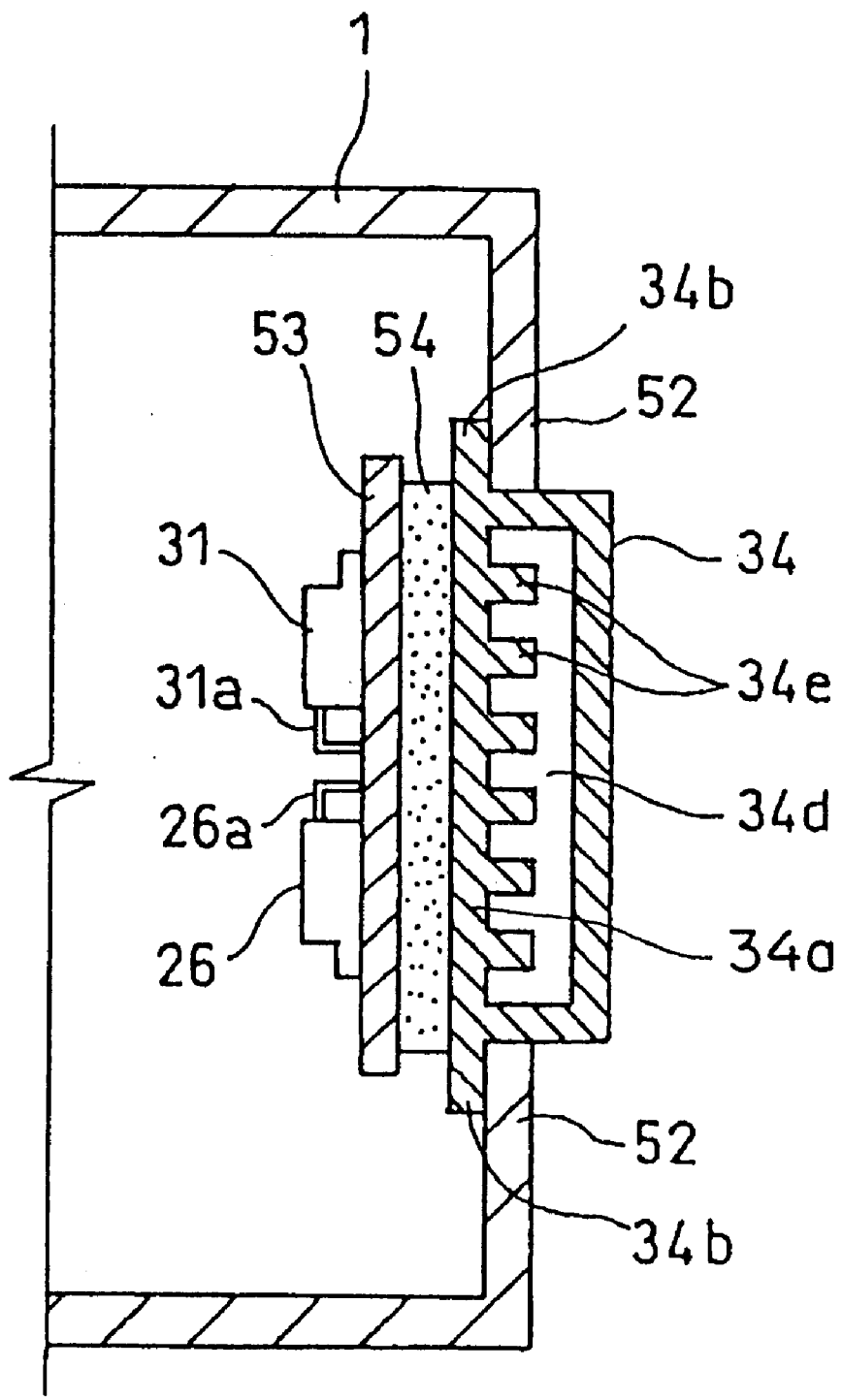
FIG. 12 is a section view of FIG. 11.

As shown in FIGS. 11 and 12, each of the heat generating elements 26 and 31 is in contact with the front face portion 34a of the support rail 34 via the attachment substrate 53. Alternatively, the direction of the attachment substrate 53 may be reversed so as to form a configuration in which the heat generating elements 26 and 31 are directly in contact with the electrical insulating member 54.

Furthermore, the member 54 is not always necessary and may be omitted as far as insulation between the elements is ensured. On the other hand, the attachment substrate 53 or the heat generating elements 26 and 31 may be directly in contact with the lower face portion 34a of the support rail 34.

Moreover, the attachment substrate 53 may be formed as a heat generating element attaching member, or the attachment substrate 53 and the member 54 may be combined to be formed as a heat generating element attaching member.

According to the embodiment of FIGS. 10 to 12, it is not necessary to incorporate a heat radiating plate in the housing 1, and hence the power source device can be miniaturized. Heat radiation can be performed through the support rail 34, and the heat radiating capacity can be sufficiently obtained. Therefore, it is possible to incorporate a heat generating element of a large capacity.

A case where a plurality of such power source devices are accommodated and used in a control panel (table) under a state the devices are supported by the support rail 34 will be described.

In a power source device of a structure of the conventional art, heat generated by the device easily stagnates in the control panel. Therefore, a suction port is disposed on one side of the control panel, and air is discharged from the other side by an exhaust fan so that the heat in the control panel is discharged together with the discharged air. As a result, the conventional structure has a defect that air is sucked together with dust through the suction port into the control panel, and the air in the panel is contaminated. When air discharge is to be sufficiently performed only by an exhaust fan, it is necessary to discharge air by a large exhaust fan. Since the suction port is formed in the control panel, there is a great disadvantage that, when the panel is disposed in a place which is exposed to the weather or is moist, a waterproofing countermeasure which is high in cost is required.

Figure 13:
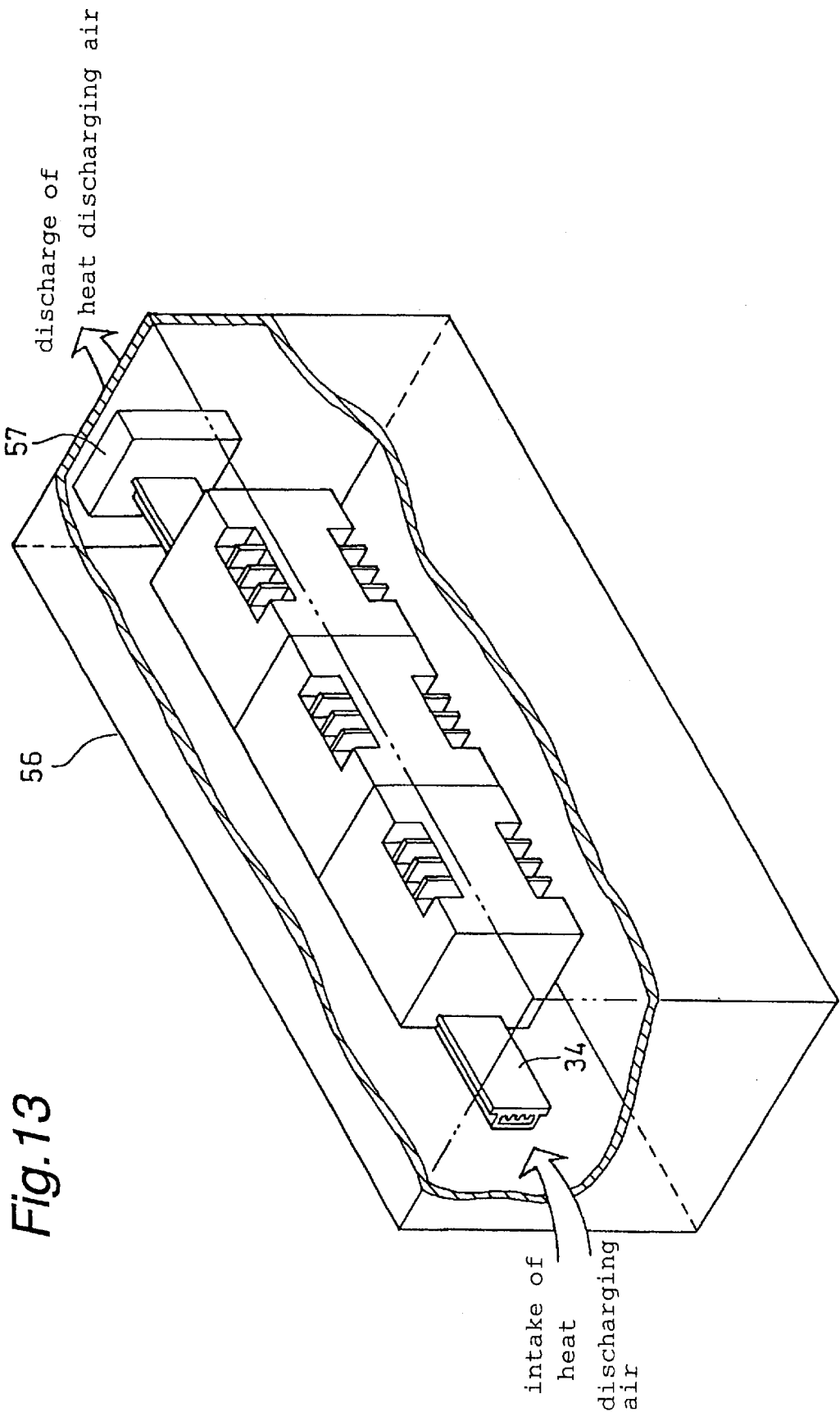
FIG. 13 is a partial cutaway view of a control panel showing a state where the power source device of FIG. 10 into the panel via a support rail.

The support rail 34 for supporting a power source device 55 of the embodiment has the cavity 34d which is passed from one end side to the other end side in the body portion 34c. As shown in FIG. 13, the support rail 34 is passed through a control panel 56. Therefore, the space in the control panel is separated from the cavity 34d in the support rail. For example, the outside air is taken in as a heat discharging gas from the inlet on one side of the cavity 34d disposed in the support rail 34, and the outside air is discharged from the inside of the cavity 34d to the other end outlet. In the discharge of the outside air, therefore, heat generated by heat generating elements incorporated in the power source device 55 in the control panel 56 is transmitted to the air in the cavity 34d of the support rail 34, and then discharged to the outside, resulting in a high heat radiation efficiency.

Furthermore, since it is not required to form another suction port in the control panel 56, the air itself in the control panel 56 is isolated from the outside. Unlike the conventional art, consequently, air is not sucked together with dust through a suction port into the control panel 56, and the air in the control panel 56 is not contaminated.

Moreover, the support rail 34 can be easily cooled, and hence its heat radiation efficiency can be enhanced more easily.

Since the control panel 56 can be hermetically sealed, the panel may be configured so as to have good waterproofness.

The support rail 34 may be fixed to the control panel 56 by screws. The flowing direction of air in the cavity 34d of the support rail 34 may be controlled by a fan 57. However, this is not essential. Detailed illustration of the sate of attaching the fan 57 to the support rail 34 is omitted.

INDUSTRIAL APPLICABILITY

The invention is not restricted to an electronic device such as a power source device, and may be applied to another electronic device which comprises a heat generating element inside a housing.

What is claimed is:

1. An electronic device comprising:
   a housing in which a rear portion is opened; a first metal member facing an inside and an outside of said housing and covering the rear opening of said housing;
   a second metal member provided for said first metal member and positioned within said housing; and
   a heat generating element arranged in a manner so as to be attached to said second metal member in said housing, wherein a support member attaching portion for attaching said housing to a support member detachably is provided for a portion of said first member facing the outside of said housing.

2. An electronic device according to claim 1, wherein said support member attaching portion can be grounded through a support member attached to said support member attaching portion.

3. An electronic device having: a housing in which a rear portion is opened, and which has an attaching hole for attaching a terminal block in a front side; and a device configuring member which can be incorporated into said housing through the housing rear opening, said device configuring member including at least: a circuit board on which said terminal block is mounted; a heat generating element; and a metal member,
   said circuit board being accommodated in said housing so that said mounted terminal block positionally corresponds to said attaching hole of said housing,
   said metal member serving as a covering member for said housing rear opening, said heat generating element being attached to at least a portion of said metal member which is located in said housing.

4. An electronic device according to claim 3, wherein, under an integrated state in which said circuit board is attached to said metal member, said device configuring member can be accommodated into said housing through said housing rear opening.

5. An electronic device having:
   a housing in which a rear portion is opened, and which has an attaching hole for attaching a terminal block in a front side; and
   a device configuring member which can be incorporated into said housing through said housing rear opening,
   said device configuring member including at least: a circuit board on which said terminal block is mounted; a heat generating element; and first and second metal members,
   said circuit board being accommodated in said housing so that said mounted terminal block positionally corresponds to said attaching hole of said housing,
   said first metal member serving as a covering member for said rear opening of said housing in a state in which said first metal member is incorporated into said housing, and
   said second metal member being provided for said first metal member and accommodated in said housing, said heat generating element being attached to said second metal member.

6. An electronic device according to claim 5, wherein said device configuring member is an integrated material in which said circuit board is attached to at least one of said first or second metal member, said device configuring member can be accommodated into said housing through said housing rear opening.

7. An electronic device according to claim 5, wherein said circuit board includes first and second circuit boards which are respectively located and accommodated in front and rear sides of said housing so as to be separated from each other in parallel with or in substantially parallel with each other,
   said terminal block is mounted on said first circuit board,
   an electronic component constituting a noise filter circuit is mounted on said first circuit board, and
   an electronic component generating electrical noises is mounted on said second circuit board.

8. An electronic device according to claim 3 or 5, wherein a rear portion of a housing is supported by a support rail made of a metal, said heat generating element attaching member is placed so as to face a rear opening of said housing, said heat generating element attaching member or said heat generating element is enabled to be directly or indirectly in contact with said support rail under a state where said support rail is attached to said opening, and the contact allows heat generated by said heat generating element to be radiated to a side of said support rail.

* * * * *